United States Patent
Igarashi et al.

(10) Patent No.: US 8,063,675 B2
(45) Date of Patent: Nov. 22, 2011

(54) DELAY CIRCUIT INCLUDING FIRST AND SECOND INTERNAL DELAY CIRCUITS AND A SELECTION SWITCH

(75) Inventors: Atsushi Igarashi, Chiba (JP); Masakazu Sugiura, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 12/686,703

(22) Filed: Jan. 13, 2010

(65) Prior Publication Data
US 2010/0176854 A1    Jul. 15, 2010

(30) Foreign Application Priority Data
Jan. 13, 2009    (JP) ................................ 2009-004271

(51) Int. Cl.
*H03L 7/00* (2006.01)

(52) U.S. Cl. ........ 327/143; 327/142; 327/161; 327/198; 327/395

(58) Field of Classification Search .............. 327/143, 327/161, 395
See application file for complete search history.

(56) References Cited

U.S. PATENT DOCUMENTS
| | | | | |
|---|---|---|---|---|
| 5,532,969 A | * | 7/1996 | Houghton et al. | 365/185.16 |
| 6,044,027 A | * | 3/2000 | Zheng et al. | 365/194 |
| 2002/0027465 A1 | * | 3/2002 | Yoshikawa | 327/277 |

FOREIGN PATENT DOCUMENTS
JP    2007-096661 A    4/2007

* cited by examiner

*Primary Examiner* — Lincoln Donovan
*Assistant Examiner* — John Poos
(74) *Attorney, Agent, or Firm* — Brinks Hofer Gilson & Lione (57) ABSTRACT

Provided is a delay circuit that has a delay time period independent of a power supply voltage and has the equal delay time period between a case of a change in input signal from Low to High and a case of a change in input signal from High to Low. The delay time period is determined as a time period necessary for a voltage of a capacitor (17) (internal voltage (Va)) to increase from a ground voltage (VSS) to a voltage equal to or higher than an inverting threshold voltage of a constant current inverter (19) (threshold voltage (Vtn) of an NMOS transistor (16)). Therefore, the delay time period is determined with reference to the ground voltage (VSS). Note that the same holds true for an internal delay circuit (20). If the input signal (Vin) becomes High, the delay circuit utilizes the delay time period caused by an internal delay circuit (10). On the other hand, if the input signal (Vin) becomes Low, the delay circuit utilizes the delay time period caused by the internal delay circuit (20). Those internal delay circuit (10) and internal delay circuit (20) are identical with each other.

8 Claims, 7 Drawing Sheets

DELAY CIRCUIT INCLUDING FIRST AND SECOND INTERNAL DELAY CIRCUITS AND A SELECTION SWITCH

RELATED APPLICATIONS

This application claims priority under 35 U.S.C. §119 to Japanese Patent Application No. 2009-004271 filed on Jan. 13, 2009, the entire content of which is hereby incorporated by reference.

BACKGROUND OF THE MENTION

1. Field of the Invention

The present invention relates to a delay circuit for delaying and outputting an input signal.

2. Description of the Related Art

Figure 7:
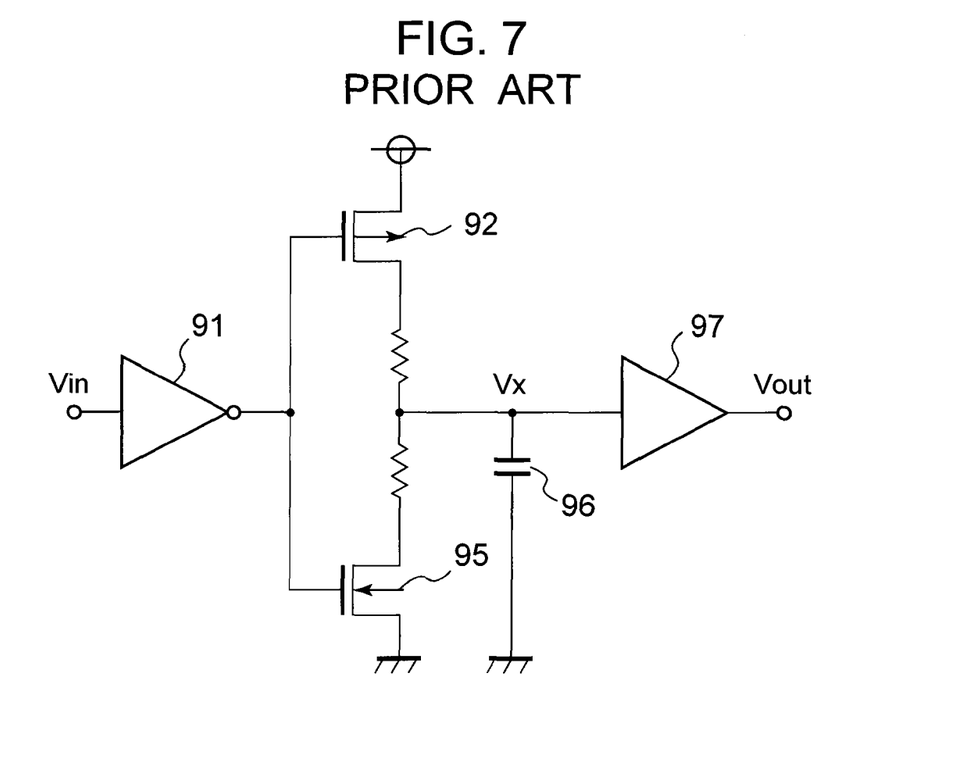
FIG. 7 is a diagram illustrating a conventional delay circuit.
Figure 8:
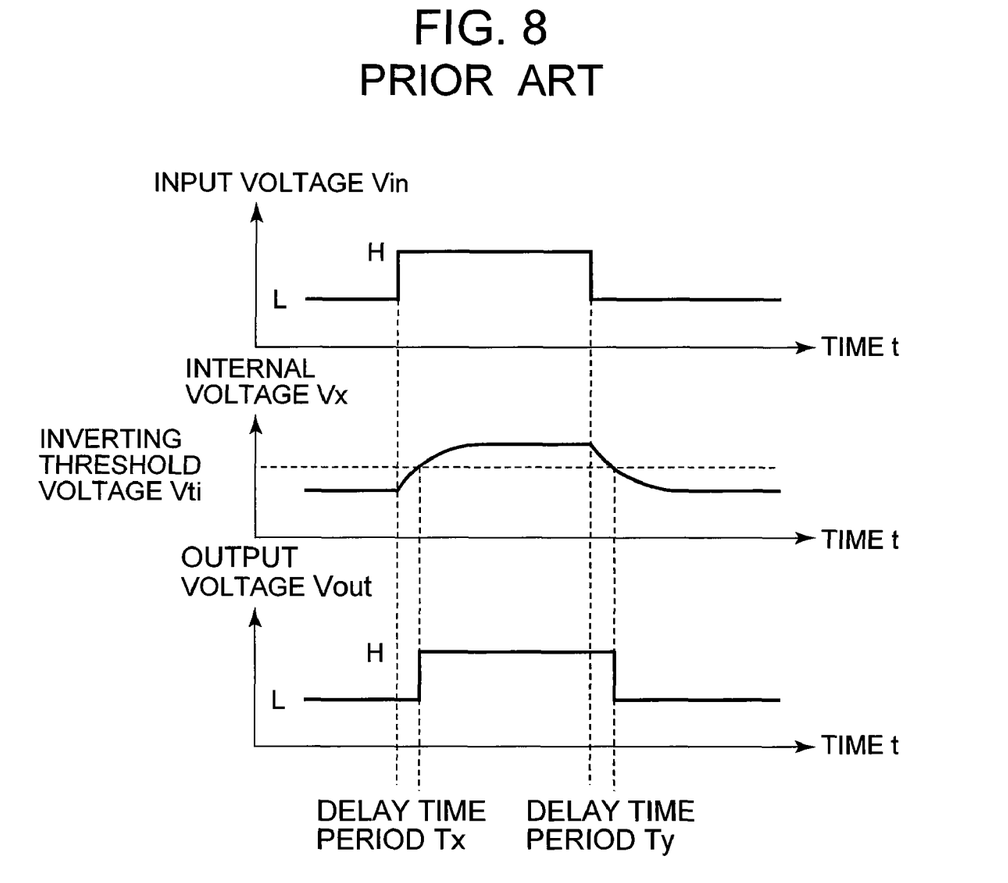
FIG. 8 is a time chart illustrating delay time periods occurring in the conventional delay circuit.

Description is given of a conventional delay circuit. FIG. 7 is a diagram illustrating the conventional delay circuit. FIG. 8 is a time chart illustrating delay time periods occurring in the conventional delay circuit.

If an input signal Vin changes from Low to High, because of an inverter 91, respective gate voltages of a P-type metal oxide semiconductor (PMOS) transistor 92 and an N-type metal oxide semiconductor (NMOS) transistor 95 become Low. Accordingly, the PMOS transistor 92 is turned ON while the NMOS transistor 95 is turned OFF. Then, the PMOS transistor 92 charges a capacitor 96 so that an internal voltage Vx may increase gradually. After a delay time period Tx occurring in the case of the input signal Vin changes from Low to High has elapsed since the input signal Vin became High, the internal voltage Vx becomes equal to or higher than an inverting threshold voltage Vti of a buffer 97. Then, an output signal Vout becomes High.

On the other hand, if the input signal Vin changes from High to Low, because of the inverter 91, the respective gate voltages of the PMOS transistor 92 and the NMOS transistor 95 become High. Accordingly, the PMOS transistor 92 is turned OFF while the NMOS transistor 95 is turned ON. Then, the NMOS transistor 95 discharges the capacitor 96 so that the internal voltage Vx may decrease gradually. After a delay time period Ty occurring in the case of the input signal Vin changes from High to Low has elapsed since the input signal Vin became Low, the internal voltage Vx becomes lower than the inverting threshold voltage Vti of the buffer 97. Then, the output signal Vout becomes Low (see, for example, JP 2007-096661 A (FIG. 5)).

In the conventional technology, if a power supply voltage VDD fluctuates, the inverting threshold voltage Vti of the buffer 97 including an inverter (not shown) or the like also fluctuates. As a result, the delay time period Tx occurring in the case of the input signal Vin changes from Low to High and the delay time period Ty occurring in the case of the input signal Vin changes from High to Low fluctuate as well.

Besides, due to manufacturing fluctuations in PMOS transistor (not shown) and NMOS transistor (not shown) included in the buffer 97, there is a risk that the inverting threshold voltage Vti may not be set to a voltage (VDD/2), which results in a problem that the delay time period Tx occurring in the case of the input signal Vin changes from Low to High and the delay time period Ty occurring in the case of the input signal Vin changes from High to Low may differ from each other.

SUMMARY OF THE INVENTION

The present invention has been made in view of the above-mentioned problem, and provides a delay circuit that has a delay time period independent of a power supply voltage and has the equal delay time period between a case of a change in input signal from Low to High and a case of a change in input signal from High to Low.

In order to solve the above-mentioned problem, according to the present invention, there is provided a delay circuit for delaying and outputting an input signal including: a first internal delay circuit; a second internal delay circuit; and a selection circuit which outputs an output signal based on respective output signals of the first internal delay circuit and the second internal delay circuit, each of the first internal delay circuit and the second internal delay circuit including: a capacitor provided to a ground terminal; a first current source; a first inverter including: a charge switch which is turned ON based on the input signal so that the capacitor is charged by the first current source; and a discharge switch which is turned ON based on the input signal so that the capacitor is discharged; and a constant current inverter including: a second current source; and an N-type metal oxide semiconductor (NMOS) transistor, the constant current inverter being configured to output an output signal of Low after a delay time period has elapsed since the charge switch was turned ON to charge the capacitor so that a voltage of the capacitor has become equal to or higher than an inverting threshold voltage of the constant current inverter, the inverting threshold voltage being determined based on a threshold voltage of the NMOS transistor, in which the output signal of the constant current inverter included in the first internal delay circuit becomes Low after the delay time period has elapsed since the input signal became High, and in which the output signal of the constant current inverter included in the second internal delay circuit becomes Low after the delay time period has elapsed since the input signal became Low.

According to the present invention, the delay time period is determined as a time period necessary for the voltage of the capacitor to increase from a ground voltage to a voltage equal to or higher than the inverting threshold voltage determined based on the threshold voltage of the NMOS transistor. Therefore, the delay time period is determined with reference to the ground voltage. As a result, the delay time period does not depend on the power supply voltage.

Further, if the input signal becomes High, the delay circuit utilizes the delay time period caused by the first internal delay circuit. On the other hand, if the input signal becomes Low, the delay circuit utilizes the delay time period caused by the second internal delay circuit. Those first internal delay circuit and second internal delay circuit are identical with each other. Therefore, the delay time period occurring when the input signal becomes High and the delay time period occurring when the input signal becomes Low are equal to each other.

DETAILED DESCRIPTION OF THE PREFERRED EMBODIMENTS

Now, referring to the accompanying drawings, embodiments of the present invention are described.

First Embodiment

Figure 1:
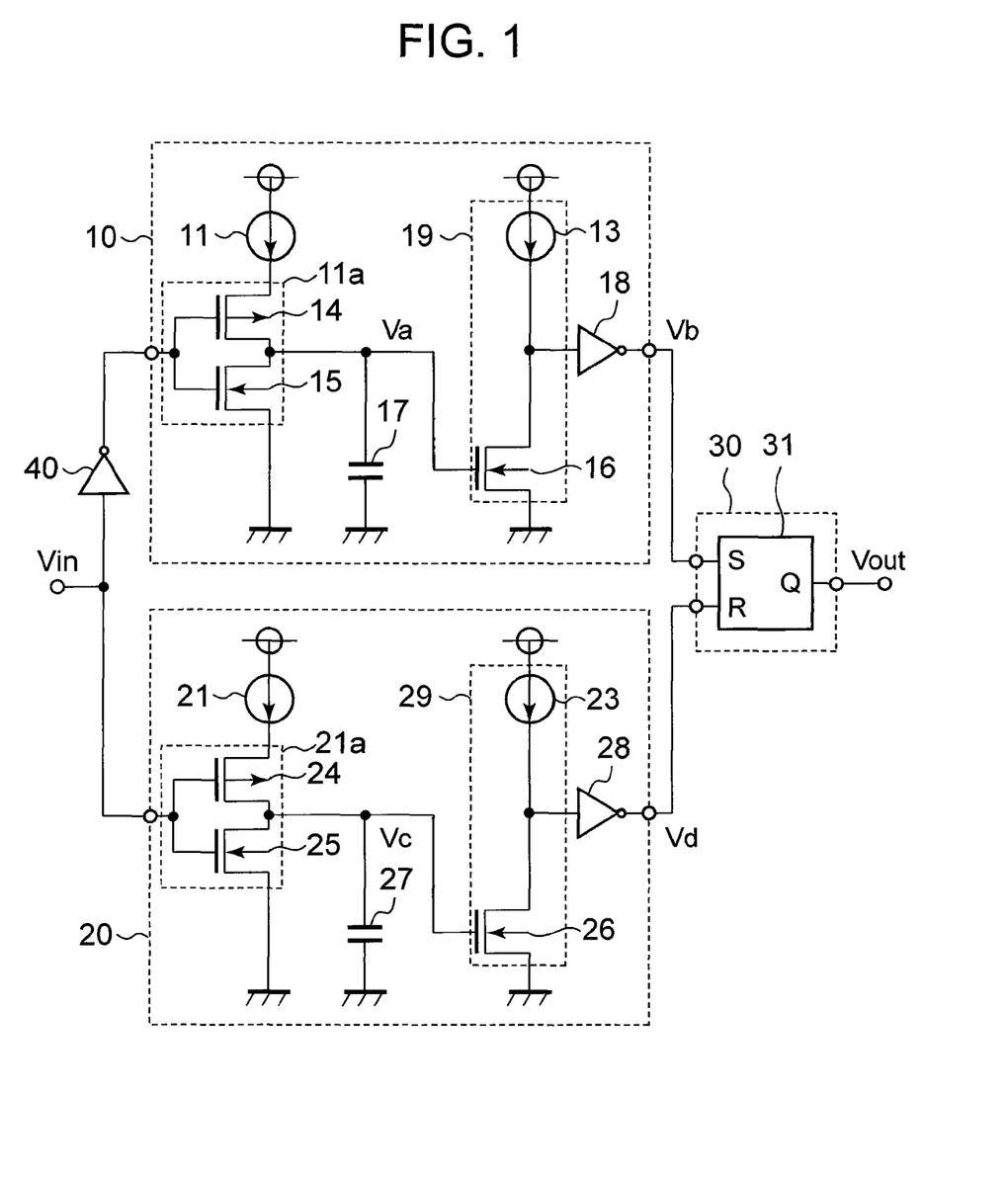
FIG. 1 is a circuit diagram illustrating a delay circuit according to a first embodiment of the present invention.

First, description is given of a configuration of a delay circuit according to a first embodiment of the present, invention. FIG. 1 is a circuit diagram illustrating the delay circuit according to the first embodiment.

In FIG. 1, an internal delay circuit 10 and an internal delay circuit 20 are denoted by different reference symbols, but have the same configuration.

The delay circuit includes an inverter 40, the internal delay circuit 10, the internal delay circuit 20, and a selection circuit 30. The internal delay circuit 10 includes a current source 11, an inverter 11a, a capacitor 17, a constant current inverter 19, and an inverter 18. The inverter 11a includes a P-type metal oxide semiconductor (PMOS) transistor 14 and an N-type metal oxide semiconductor (NMOS) transistor 15. The constant current inverter 19 includes a current source 13 and an NMOS transistor 16. The selection circuit 30 includes a latch 31.

An input terminal of the delay circuit is connected with an input terminal of the internal delay circuit 10 via the inverter 40. The input terminal of the delay circuit is further connected with an input terminal of the internal delay circuit 20. An output terminal of the internal delay circuit 10 is connected with a first input terminal of the selection circuit 30. An output terminal of the internal delay circuit 20 is connected with a second input terminal of the selection circuit 30. An output terminal of the selection circuit 30 is connected with an output terminal of the delay circuit.

The input terminal of the delay circuit is connected to respective gates of the PMOS transistor 14 and the NMOS transistor 15 via the inverter 40. The input terminal of the delay circuit is further connected to respective gates of a PMOS transistor 24 and an NMOS transistor 25. The NMOS transistor 15 has a source connected to a ground terminal. The PMOS transistor 14 has a source connected to a power supply terminal via the current source 11. The capacitor 17 is provided between the ground terminal and a connection point between a drain of the PMOS transistor 14 and a drain of the NMOS transistor 15. The NMOS transistor 16 has a gate connected to the connection point between the drain of the PMOS transistor 14 and the drain of the NMOS transistor 15. The NMOS transistor 16 has a source connected to the ground terminal, and a drain connected to the power supply terminal via the current source 13. The inverter 18 has an input terminal connected to a connection point between the current source 13 and the drain of the NMOS transistor 16. The inverter 18 has an output terminal connected to a set terminal S of the latch 31. In the delay circuit, the first internal delay circuit 10 and the second internal delay circuit 20 have different connection destinations of the input terminals of the inverter 18 and an inverter 28, and have different connection destinations of the output terminals of the inverter 18 and the inverter 28. The output terminal of the inverter 28 is connected to a reset terminal R of the latch 31. The latch 31 has an output terminal Q connected to the output terminal of the delay circuit.

If an input signal Vin becomes High while an output signal of the inverter 40 becomes Low, the PMOS transistor 14 is turned ON so that the capacitor 17 may be charged by the current source 11. If the input signal Vin becomes High, the NMOS transistor 25 is turned ON so that a capacitor 27 may be discharged. On the other hand, if the input signal Vin becomes Low while the output signal of the inverter 40 becomes High, the NMOS transistor 15 is turned ON so that the capacitor 17 may be discharged. If the input signal Vin becomes Low, the PMOS transistor 24 is turned ON so that the capacitor 27 may be charged by a current source 21.

After a delay time period has elapsed since the PMOS transistor 14 was turned ON to charge the capacitor 17, an internal voltage Va becomes equal to or higher than an inverting threshold voltage of the constant current inverter 19 (threshold voltage Vtn of the NMOS transistor 16), and then the constant current inverter 19 outputs an output signal of Low. At this time, the inverter 18 outputs an output signal of High. Note that the same operation is applied to the internal delay circuit 20.

In other words, after the delay time period has elapsed since the input signal Vin became High while the output signal of the inverter 40 became Low, the output signal of the constant current inverter 19 becomes Low while an internal voltage Vb becomes High. Similarly, after a delay time period has elapsed since the input signal Vin became Low, an output signal of a constant current inverter 29 becomes Low while an internal voltage Vd becomes High. Based on the internal voltage Vb and the internal voltage Vd, the latch 31 outputs an output signal Vout.

Figure 2:
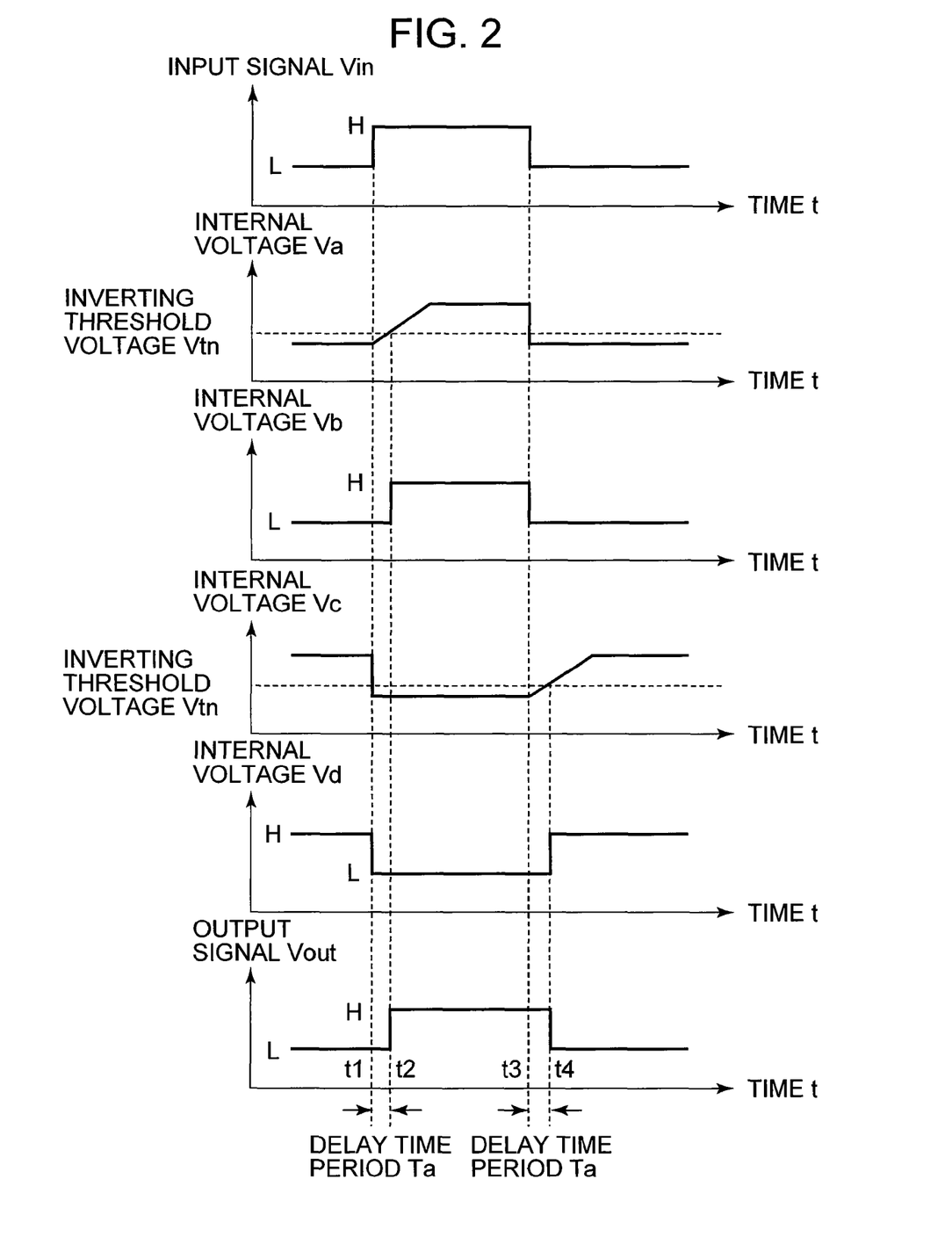
FIG. 2 is a time chart illustrating delay time periods occurring in the delay circuit of FIG. 1.

Next, description is given of an operation of the delay circuit according to the first embodiment. FIG. 2 is a time chart illustrating the delay time periods.

If $t1 \leq t < t2$, the input signal Vin becomes High while the output signal of the inverter 40 becomes Low, and accordingly the PMOS transistor 14 is turned ON while the NMOS transistor 15 is turned OFF. Then, the current source 11 charges the capacitor 17 so that the internal voltage Va may increase gradually. On this occasion, the internal voltage Va is lower than the inverting threshold voltage of the constant current inverter 19 (threshold voltage Vtn of the NMOS transistor 16). Accordingly, the NMOS transistor 16 is turned OFF, and a drain voltage of the NMOS transistor 16 (output signal of the constant current inverter 19) becomes High while the internal voltage Vb becomes Low.

On the other hand, the PMOS transistor 24 is turned OFF while the NMOS transistor 25 is turned ON. Then, an internal voltage Vc changes to Low steeply. Accordingly, the NMOS transistor 26 is turned OFF, and a drain voltage of the NMOS transistor 26 becomes High while the internal voltage Vd becomes Low.

If $t2 \leq t < t3$, the internal voltage Va becomes equal to or higher than the inverting threshold voltage of the constant current inverter 19 (threshold voltage Vtn of the NMOS transistor 16). Accordingly, the NMOS transistor 16 is turned ON, and the drain voltage of the NMOS transistor 16 (output signal of the constant current inverter 19) becomes Low while the internal voltage Vb becomes High. On this occasion, the set terminal S of the latch 31 is High, and hence the output terminal Q (output signal Vout) is also High. Note that a delay time period Ta exists between the time when the input signal Vin becomes High and the time when the output signal Vout becomes High. The delay time period Ta is determined based on each of a current of the current source 11, a capacitance of the capacitor 17, and the inverting threshold voltage of the constant current inverter 19 (threshold voltage Vtn of the NMOS transistor 16).

If t3≦t<t4, the input signal Vin becomes Low, and accordingly the PMOS transistor 24 is turned ON while the NMOS transistor 25 is turned OFF. Then, the current source 21 charges the capacitor 27 so that the internal voltage Vc may increase gradually. On this occasion, the internal voltage Vc is lower than an inverting threshold voltage of the constant current inverter 29 (threshold voltage Vtn of the NMOS transistor 26). Accordingly, the NMOS transistor 26 is turned OFF, and the drain voltage of the NMOS transistor 26 (output signal of the constant current inverter 29) becomes High while the internal voltage Vd becomes Low.

On the other hand, the output signal of the inverter 40 becomes High, and accordingly the PMOS transistor 14 is turned OFF while the NMOS transistor 15 is turned ON. Then, the internal voltage Va changes to Low steeply. Accordingly, the NMOS transistor 16 is turned OFF, and the drain voltage of the NMOS transistor 16 becomes High while the internal voltage Vb becomes Low.

If t4≦t, the internal voltage Vc becomes equal to or higher than the inverting threshold voltage of the constant current inverter 29 (threshold voltage Vtn of the NMOS transistor 26). Accordingly, the NMOS transistor 26 is turned ON, and the drain voltage of the NMOS transistor 26 (output signal of the constant current inverter 29) becomes Low while the internal voltage Vd becomes High. On this occasion, the reset terminal R of the latch 31 is High, and hence the output terminal Q (output signal Vout) is Low. Note that a delay time period Ta exists between the time when the input signal Vin becomes Low and the time when the output signal Vout becomes Low.

Figure 3:
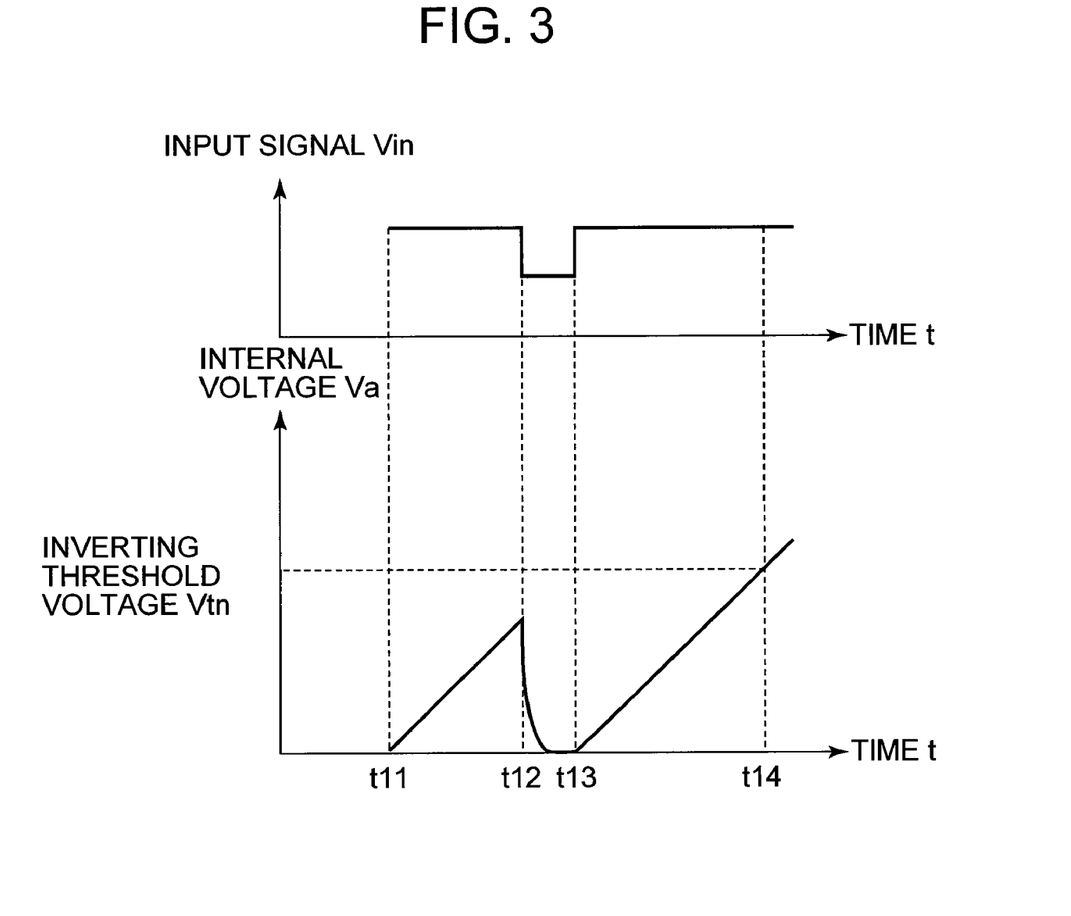
FIG. 3 is a time chart illustrating an internal voltage of the delay circuit of FIG. 1.

Now, description is given of the internal voltage Va in a case where the input voltage Vin changes from Low to High immediately after the change from High to Low. FIG. 3 is a time chart illustrating the internal voltage Va.

If t11≦t<t12, the input signal Vin becomes High, and the internal voltage Va increases gradually as described above.

If t12≦t<t13, the input signal Vin becomes Low, and the internal voltage Va changes to Low steeply as described above.

If t13≦t<t14, the input signal Vin becomes High, and the internal voltage Va increases gradually as described above.

If t14≦t, the internal voltage Va becomes equal to or higher than the inverting threshold voltage of the constant current inverter 19 (threshold voltage Vtn of the NMOS transistor 16). Accordingly, the output terminal Q (output signal Vout) becomes High as described above. Note that a delay time period Ta (Ta=t14−t13) exists between the time when the input signal Vin becomes High and the time when the output signal Vout becomes High.

With the configuration described above, the delay time period Ta is determined as a time period necessary for a voltage of the capacitor 17 (internal voltage Va) to increase from a ground voltage VSS to a voltage equal to or higher than the inverting threshold voltage of the constant current inverter 19 (threshold voltage Vtn of the NMOS transistor 16). Therefore, the delay time period Ta is determined with reference to the ground voltage VSS. As a result, the delay time period Ta does not depend on a power supply voltage VDD. Note that the same holds true for the internal delay circuit 20.

Further, if the input signal Vin becomes High, the delay circuit utilizes the delay time period Ta caused by the internal delay circuit 10. On the other hand, if the input signal Vin becomes Low, the delay circuit utilizes the delay time period Ta caused by the internal delay circuit 20. Those internal delay circuit 10 and internal delay circuit 20 are identical with each other. Therefore, the delay time period occurring when the input signal Vin becomes High and the delay time period occurring when the input signal Vin becomes Low are equal to each other.

Besides, when the input signal Vin changes from High to Low, a delay time period Ta is reset immediately. Therefore, a delay time period Ta occurring when the input signal Vin changes from Low to High after the reset is accurate. The same holds true for the case where the input signal Vin changes from Low to High.

Note that the selection circuit 30 includes the latch 31. However, although not illustrated, the selection circuit 30 is not limited thereto. The selection circuit 30 may be any circuit capable of selecting between the internal voltage Vb and the internal voltage Vd and outputting the selected voltage, such as a flip-flop.

Second Embodiment

Figure 4:
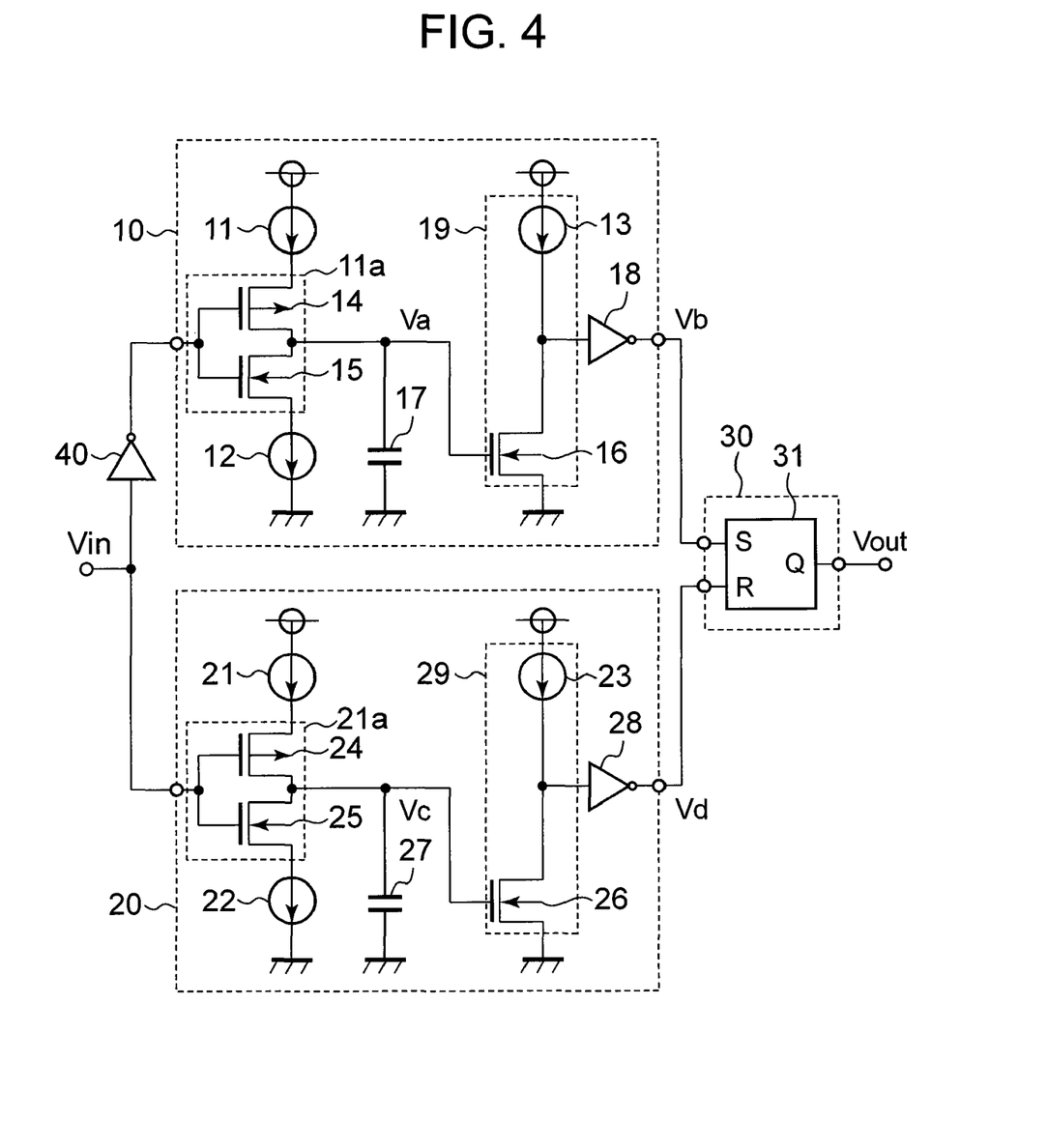
FIG. 4 is a circuit diagram illustrating a delay circuit according to a second embodiment of the present invention.

First, description is given of a configuration of a delay circuit according to a second embodiment of the present invention. FIG. 4 is a circuit diagram illustrating the delay circuit according to the second embodiment.

As compared to the delay circuit of the first embodiment, a current source 12 is added in the first internal delay circuit 10 of the delay circuit according to the second embodiment, and a current source 22 is added in the first internal delay circuit 20 of the delay circuit according to the second embodiment.

The current source 12 is provided between the source of the NMOS transistor 15 and the ground terminal. The current source 22 is provided between the source of the NMOS transistor 25 and the ground terminal.

If the input signal Vin becomes High while the output signal of the inverter 40 becomes Low, the PMOS transistor 14 is turned ON so that the capacitor 17 may be charged by the current source 11. If the input signal Vin becomes High, the NMOS transistor 25 is turned ON so that the capacitor 27 may be discharged by a current source 22. On the other hand, if the input signal Vin becomes Low while the output signal of the inverter 40 becomes High, the NMOS transistor 15 is turned ON so that the capacitor 17 may be discharged by the current source 12. If the input signal Vin becomes Low, the PMOS transistor 24 is turned ON so that the capacitor 27 may be charged by the current source 21.

Figure 5:
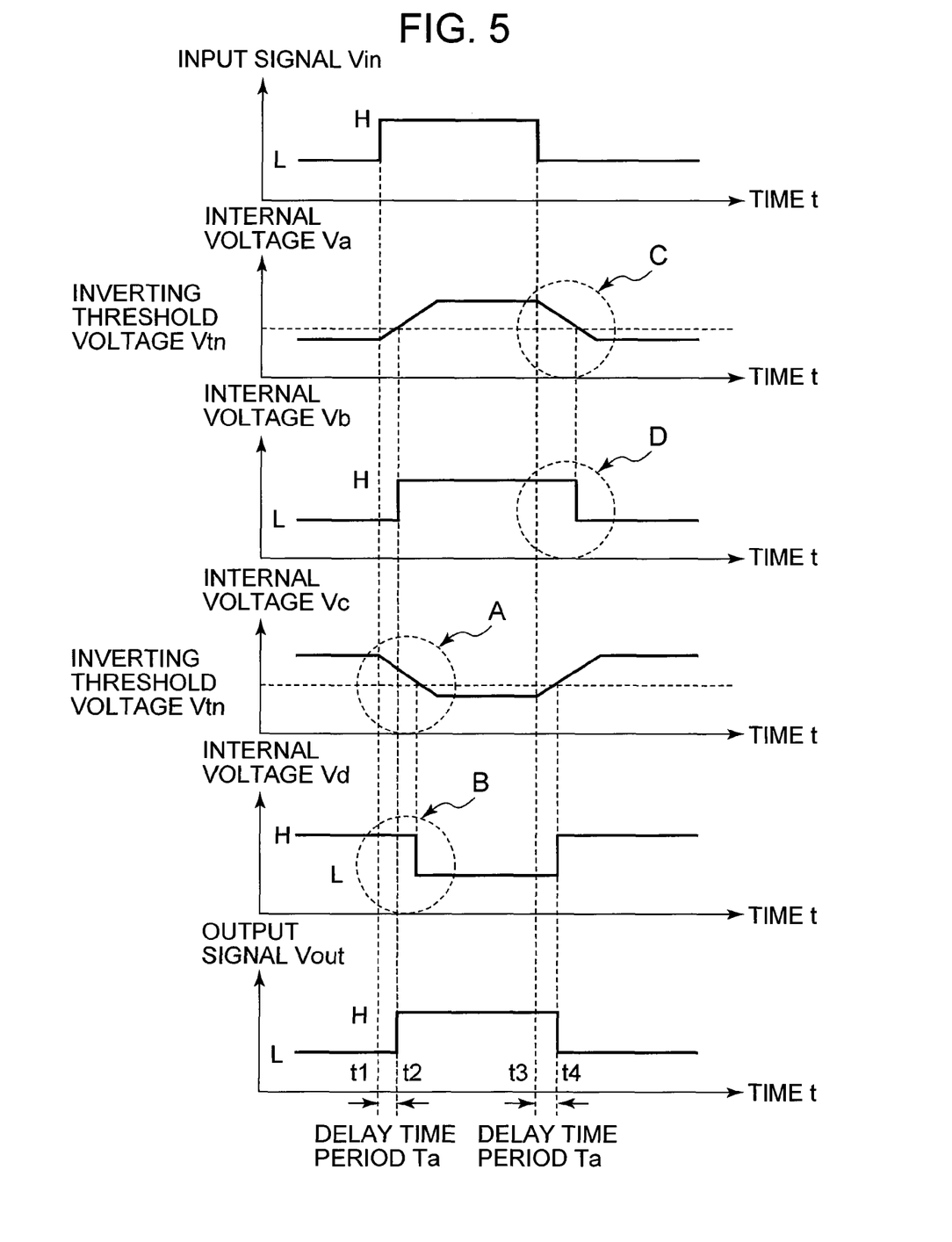
FIG. 5 is a time chart illustrating delay time periods occurring in the delay circuit of FIG. 4.

Next, description is given of an operation of the delay circuit according to the second embodiment. FIG. 5 is a time chart illustrating delay time periods.

In the case of FIG. 2, if t1≦t<t3, the input signal Vin becomes High, and the PMOS transistor 24 is turned OFF while the NMOS transistor 25 is turned ON, to thereby change the internal voltage Vc to Low steeply. On the other hand, as indicated by A of FIG. 5, because of the discharge by the current source 22, the internal voltage Vc decreases gradually.

In the case of FIG. 2, following the steep change of the internal voltage Vc to Low, the internal voltage Vd also changes to Low steeply. On the other hand, as indicated by B of FIG. 5, because of the discharge by the current source 22, the internal voltage Vd is prevented from changing to Low steeply until the internal voltage Vc decreases from the power supply voltage VDD to be lower than the inverting threshold voltage Vtn, that is, a predetermined time period has elapsed.

In the case of FIG. 2, if t3≦t, the input signal Vin becomes Low while the output signal of the inverter 40 becomes High, and accordingly the PMOS transistor 14 is turned OFF while the NMOS transistor 15 is turned ON. Then, the internal voltage Va changes to Low steeply. On the other hand, as indicated by C of FIG. 5, because of the discharge by the current source 12, the internal voltage Va decreases gradually. Note that a predetermined time period on this occasion is not included in the delay time period.

In the case of FIG. 2, following the steep change of the internal voltage Va to Low, the internal voltage Vb also changes to Low steeply. On the other hand, as indicated by D of FIG. 5, because of the discharge by the current source 12, the internal voltage Vb is prevented from changing to Low steeply until the internal voltage Va decreases from the power supply voltage VDD to be lower than the inverting threshold voltage Vtn, that is, a predetermined time period has elapsed. Note that the predetermined time period on this occasion is not included in the delay time period.

Figure 6:
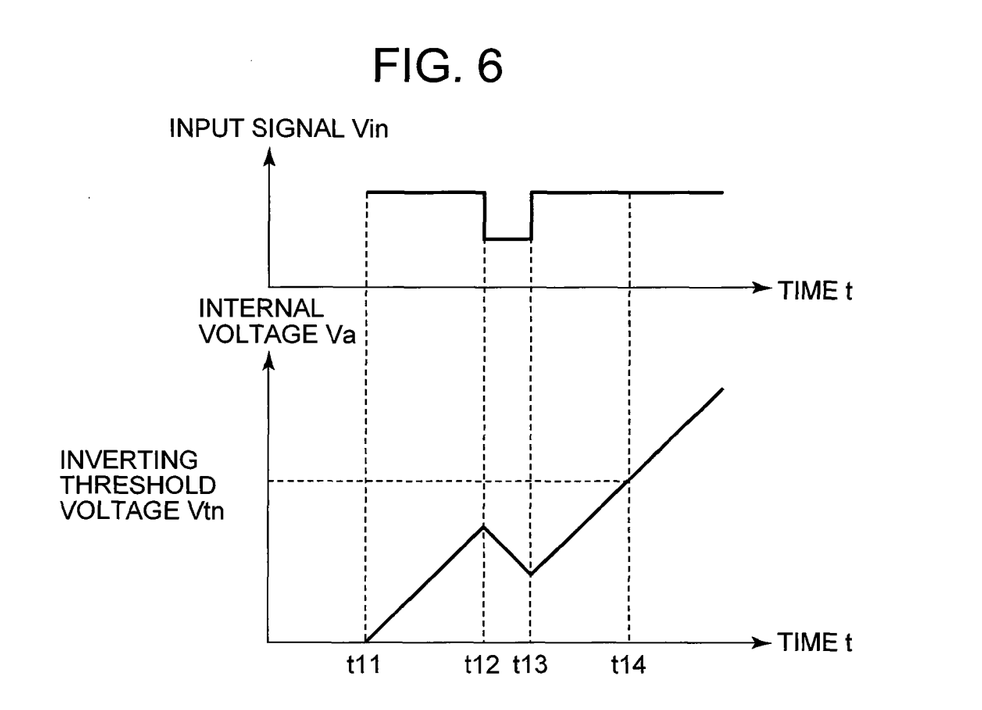
FIG. 6 is a time chart illustrating an internal voltage of the delay circuit of FIG. 4.

Now, description is given of the internal voltage Va in a case where the input voltage Vin changes from Low to High immediately after the change from High to Low. FIG. 6 is a time chart illustrating the internal voltage Va.

If $t11 \leq t < t12$, the input signal Vin becomes High, and the internal voltage Va increases gradually as described above.

If $t12 \leq t < t13$, the input signal Vin becomes Low, and the internal voltage Va decreases gradually as described above.

If $t13 \leq t < t14$, the input signal Vin becomes High, and the internal voltage Va increases gradually as described above.

If $t14 \leq t$, the internal voltage Va becomes equal to or higher than the inverting threshold voltage of the constant current inverter 19 (threshold voltage Vtn of the NMOS transistor 16). Accordingly, the output terminal Q (output signal Vout) becomes High as described above. Note that a delay time period Ta (Ta=t14−t13) exists between the time when the input signal Vin becomes High and the time when the output signal Vout becomes High.

Besides, when the input signal Vin changes from High to Low, a delay time period Ta is reset not immediately but gradually. Therefore, if the input signal Vin changes to High after the change from High to Low due to noise or the like, a delay time period Ta is not counted again from 0. The same holds true for the case where the input signal Vin changes from Low to High.

What is claimed is:

1. A delay circuit comprising:
    a first internal delay circuit and a second internal delay circuit which respectively receive an input signal and an inverted input signal; and
    a selector which outputs an output signal whose outset and end are defined respectively by a delayed outset of the input signal and a delayed end of the input signal supplied from the first and second internal delay circuits,
    the first and second delay circuits being of an identical construction each comprising:
        a first inverter arranged between a first current source and a ground and comprising a charge switch and a discharge switch which function inversely to each other;
        a capacitor being in direct connection to the first current source via the charge switch and to the ground via the discharge switch, such that the capacitor exhibits, during charging thereof, a rising voltage which is a function of only a capacitance of the capacitor and a current supplied from the first current source; and
        a constant current inverter which defines a threshold for detecting the rising voltage of the capacitor, wherein the constant current inverter comprises a second current source and a sensor switch driven by the second current source to operate when the rising voltage of the capacitor crosses the threshold.

2. The delay circuit according to claim 1, wherein the charge and discharge switches respectively comprise a PMOS transistor and an NMOS transistor connected directly via drains thereof, whose gates commonly receive the input signal or the inverted input signal.

3. The delay circuit according to claim 2, wherein the PMOS transistor has a source connected to the first current source and the NMOS transistor has a source connected to ground, whose drains are connected directly to each other and to the capacitor.

4. The delay circuit according to claim 3, wherein the source of the NMOS transistor is connected to ground via a third current source.

5. The delay circuit according to claim 1, wherein the sensor switch comprises a transistor connected between the second current source and ground, whose gate is connected to the capacitor to sense the rising voltage of the capacitor, wherein the threshold is a gate voltage to operate the transistor.

6. The delay circuit according to claim 5, wherein the transistor comprises an NMOS transistor whose drain is in direct connection to the second current source and whose source is in direct connection to ground.

7. The delay circuit according to claim 1, further comprising a second inverter which reverses its output when the constant current inverter detects the rising voltage.

8. The delay circuit according to claim 1, wherein the selector is a flip-flop which is set and reset respectively by the first and second internal delay circuits.

\* \* \* \* \*